(12) United States Patent
Thomason et al.

(10) Patent No.: US 10,593,760 B2
(45) Date of Patent: Mar. 17, 2020

(54) METHOD FOR FORMING TRENCH SEMICONDUCTOR DEVICE HAVING SCHOTTKY BARRIER STRUCTURE

(71) Applicant: SEMICONDUCTOR COMPONENTS INDUSTRIES, LLC, Phoenix, AZ (US)

(72) Inventors: Michael Thomason, Blackfoot, ID (US); Mohammed T. Quddus, Chandler, AZ (US); Mihir Mudholkar, Tempe, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/053,400

(22) Filed: Aug. 2, 2018

(65) Prior Publication Data
US 2020/0044027 A1 Feb. 6, 2020

(51) Int. Cl.
*H01L 29/08* (2006.01)
*H01L 29/47* (2006.01)
(Continued)

(52) U.S. Cl.
CPC ...... *H01L 29/0891* (2013.01); *H01L 21/0435* (2013.01); *H01L 21/28537* (2013.01); *H01L 29/47* (2013.01); *H01L 29/872* (2013.01)

(58) Field of Classification Search
CPC combination set(s) only.
See application file for complete search history.

(56) References Cited

U.S. PATENT DOCUMENTS 6,184,564 B1 2/2001 Gould
6,621,107 B2 9/2003 Blanchard et al.
(Continued)

FOREIGN PATENT DOCUMENTS

EP 0111364 B1 3/1989
WO 2010096261 A3 11/2010

OTHER PUBLICATIONS

Kent Walters, Bob Werner; Micro Notes Series 401; Introduction to Schottky Rectifiers; 2 pages.
(Continued)

*Primary Examiner* — Marvin Payen
(74) *Attorney, Agent, or Firm* — Kevin B. Jackson

(57) ABSTRACT

A method for forming a semiconductor device includes providing a region of semiconductor material. The method includes providing a trench structure having a trench extending into the region of semiconductor material from a first major surface, and a conductive material disposed within the trench and separated from the region of semiconductor material by a dielectric region. The method includes providing a Schottky contact region disposed adjacent to the first major surface and adjacent to the trench structure. In one example, providing the Schottky contact region comprises forming a first layer of material consisting essentially of titanium and having a first thickness; forming a second layer of material disposed adjacent to the first layer of material consisting essentially of nickel-platinum and having a second thickness; annealing the first layer of material and the second layer of material; and after the step of annealing, removing any unreacted portions of the first layer of material and the second layer of material. In another example, providing the Schottky contact region comprises providing a layer of material consisting essentially of nickel-chrome.

18 Claims, 11 Drawing Sheets

(51) Int. Cl.
  *H01L 21/285* (2006.01)
  *H01L 21/04* (2006.01)
  *H01L 29/872* (2006.01)

(56) References Cited

U.S. PATENT DOCUMENTS

| | | |
|---|---|---|
| 6,800,897 B2 | 10/2004 | Baliga |
| 6,846,729 B2 | 1/2005 | Andoh et al. |
| 7,749,877 B2 | 7/2010 | Carta et al. |
| 8,044,461 B2 | 10/2011 | Session |
| 8,143,655 B2 | 3/2012 | Chiola |
| 8,148,749 B2 | 4/2012 | Grebs et al. |
| 8,168,466 B2 | 5/2012 | Quddus et al. |
| 8,664,065 B2 | 3/2014 | Grivna |
| 2004/0208214 A1 | 10/2004 | Kawasaki et al. |
| 2007/0212862 A1 | 9/2007 | Carta et al. |
| 2007/0284628 A1 | 12/2007 | Kapoor |
| 2007/0290234 A1 | 12/2007 | Wu |
| 2011/0135942 A1 | 6/2011 | Yamakoshi |
| 2011/0215338 A1 | 9/2011 | Zhang |
| 2011/0227135 A1 | 9/2011 | Lin et al. |
| 2012/0088342 A1 | 4/2012 | Ming et al. |
| 2012/0139015 A1 | 6/2012 | Yu et al. |
| 2014/0017888 A1 | 1/2014 | Hsu et al. |
| 2014/0073130 A1 | 3/2014 | Hilscher et al. |
| 2014/0206190 A1 | 7/2014 | Li et al. |
| 2014/0248761 A1 | 9/2014 | Park et al. |
| 2014/0306291 A1 | 10/2014 | Alptekin et al. |
| 2014/0346608 A1 | 11/2014 | Kim |
| 2016/0189962 A1 | 6/2016 | Konrath et al. |

OTHER PUBLICATIONS

Schottky barrier ; http://en.wikipedia.org/wiki/Schottky_barrier ; 4 pages.
Rectifier ; From Wikipedia, the free encyclopedia ; 1 page.
J. Foggiato (WaferMasters, Inc.) ; Optimizing the Formation of Nickel Silicide ; EMRS 2004,Material Science Issues in Advanced CMOS Source-drain Engineering; Dec. 15, 2004.
W.L. Tan (University of Singapore) ; Effect of a Titanium Cap in Reducing Interfacial Oxides in the Formation of Nickel Silicide ; Journal of Applied Physics ; J. Appl. Phys. 91,2901 (2002).

METHOD FOR FORMING TRENCH SEMICONDUCTOR DEVICE HAVING SCHOTTKY BARRIER STRUCTURE

CROSS-REFERENCE TO RELATED APPLICATIONS

Not Applicable.

BACKGROUND

The present invention relates, in general, to electronics and, more particularly, to semiconductor device structures and methods of forming semiconductor devices.

A Schottky device is a type of semiconductor device that exhibits a low forward voltage drop and a very fast switching action. The lower forward voltage drop translates into less energy wasted as heat, which provides improved system efficiency and higher switching speed compared to conventional PN junction diodes. This makes Schottky devices more suitable for applications requiring higher efficiency power management. Such applications include wireless and automotive devices, boost converters for LCD/keypad backlighting, engine control, automotive lighting, charge circuits as well as other small and large signal applications.

With demands to further improve battery life in these applications and others, the market is requiring even higher efficiency devices, such as Schottky devices having lower power dissipation, higher power density, and smaller die size. Some Schottky devices are formed using insulated trench gated structures. In such devices, a semiconductor mesa region is typically disposed between a pair of insulated trench gated structures, and the Schottky barrier is formed along the top of the semiconductor mesa region. One problem with Schottky devices using insulated trench gated structures is that upper corner regions of the semiconductor mesa regions are susceptible to stress caused by, among other things, high temperature processing used to form the Schottky barrier structure. Such stress issues can result in diminished device performance including increased leakage current.

Although Schottky devices using insulated trench gated structures have shown improvements in performance, improvements are still needed in structures and methods that provide selectable barrier heights. In addition, structures and methods are needed that reduce the effects of high stress particularly proximate to corner regions of semiconductor mesa regions adjacent the trench gated structures.

Accordingly, it is desired to have structures and methods for providing Schottky devices with selectable barrier heights, such as Schottky devices with insulated trench gated structures. In addition, it is desired that the selectable barrier heights include, for example, barrier heights in a range from about 0.45 eV to about 0.85 eV. Additionally, it is desired that the structures and methods reduce stress related device performance issues associated with Schottky devices with insulated trench gates structures. Further, it is also beneficial for the structures and methods to be cost effective and easy to integrate into preexisting process flows. Finally, it is also beneficial for the structures and methods to provide design flexibility and equal or better electrical performance compared to prior structures.

Figure 1:
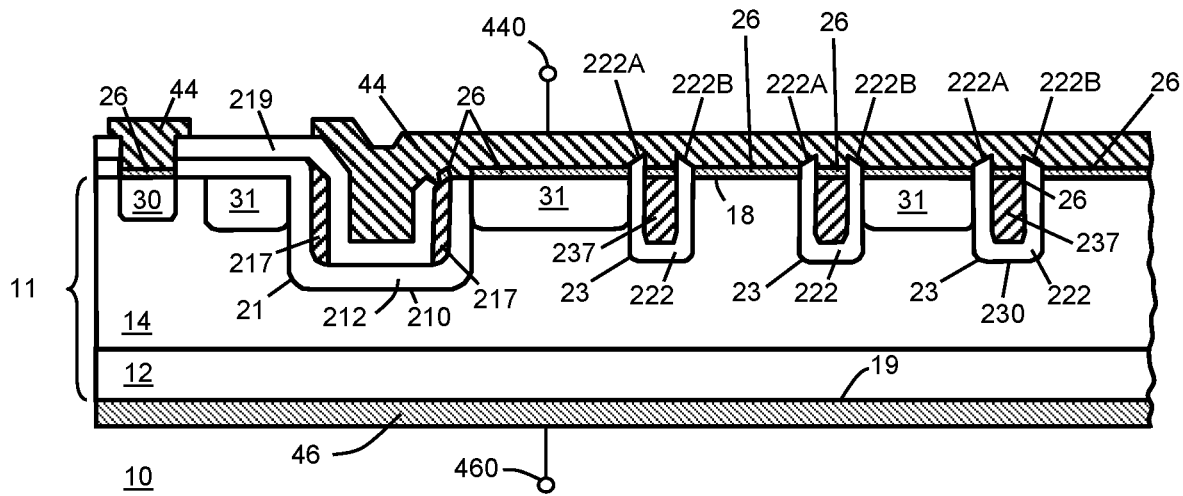
FIG. 1 illustrates a partial cross-sectional view of an example of a semiconductor device in accordance with the present description.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor. Although the devices are explained herein as certain N-type regions and certain P-type regions, a person of ordinary skill in the art understands that the conductivity types can be reversed and are also possible in accordance with the present description, taking into account any necessary polarity reversal of voltages, inversion of transistor type and/or current direction, etc. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term major surface when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions. As used herein, the term and/or includes any and all combinations of one or more of the associated listed items. In addition, the terminology used herein is for the purpose of describing particular examples only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. It will be appreciated by those skilled in the art that words, during, while, and when as used herein related to circuit operation are not exact terms that mean an action takes place instantly upon an initiating action but that there may be some small but reasonable delay, such as propagation delay, between the reaction that is initiated by the initial action. Additionally, the term while means a certain action occurs at least within some portion of a duration of the initiating action. The use of word about, about or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. Unless specified otherwise, as used herein the word overlapping includes orientations, placements, or relations where the specified elements can at least partly or wholly coincide or align in the same or different planes. It is further understood that the examples illustrated and described hereinafter suitably may have examples and/or may be practiced in the absence of any element that is not specifically disclosed herein.

DETAILED DESCRIPTION OF THE DRAWINGS

In general, the present embodiments relate to a semiconductor device and method of forming the semiconductor device having a Schottky contact region formed from a conductive structure, such as a combination of conductive materials capable of forming silicides including titanium and nickel-platinum. In some examples, a layer of titanium is provided first followed by a layer of nickel-platinum. The combination of conductive materials is then exposed to a predetermined elevated temperature to form one or more silicide regions within the semiconductor device. In another example, the conductive structure includes a combination of materials that comprises a nickel-chrome alloy layer, which is subsequently exposed to a predetermined elevated temperature to form one or more silicide regions within the semiconductor device. In some examples, the nickel-chrome alloy is an as-deposited mixture or combination of nickel and chrome.

The Schottky contact regions in accordance with the present description provide predetermined Schottky barrier heights within a desired 0.45 eV to 0.85 eV range, provide a semiconductor device with improved power dissipation in certain applications, and provide a semiconductor device with reduced stress-related defects, which, among other things, reduces leakage current. In addition, the Schottky contact regions in accordance with the present description reduce the amount of silicide migration in the area of the trench gate oxide, which further improves device performance. The reduced silicide migration is one important factor in obtaining proper device function in Schottky devices using insulated trench gated structures. The structure and method can be easily implemented into existing process flows, which saves on manufacturing costs and cycle time.

In some examples, the combination of materials consists essentially of a layer of titanium and a layer of nickel-platinum (with various levels of Pt, including, for example, 5%, 15%, 60%, 80%). In other examples, the combination of materials consists of a layer of titanium and a layer of nickel-platinum (with various levels of Pt, including, for example, 5%, 15%, 60%, 80%). In further examples, it is preferred that the as-formed (i.e., before silicide is formed) thickness ratio of titanium to nickel-platinum be greater than or equal to about 1.33:1. In other preferred examples, the as-formed thickness ratio be greater than or equal to about 2:1. In some preferred examples, the as-formed thickness ratio be greater than or equal to 3:1. In further preferred examples, it is preferred that the as-formed thickness ratio be about 6:1. In other examples, the combination of materials comprises nickel-chrome (for example, a 40% nickel/60% chrome alloy). In further examples, the combination of material consists essentially of nickel-chrome (for example, a 40% nickel/60% chrome alloy). In still further examples, the combination of materials consists of nickel-chrome (for example, a 40% nickel/60% chrome alloy).

More particularly, a method of forming a semiconductor device, comprises providing a region of semiconductor material comprising a first major surface and a second major surface opposite to the first major surface. The method includes providing a trench structure comprising a trench extending into the region of semiconductor material from the first major surface; and a conductive material disposed within the trench and separated from the region of semiconductor material by a dielectric region. The method includes providing a Schottky contact region disposed adjacent to the first major surface and adjacent to the trench structure, wherein providing the Schottky contact region includes forming a first layer of material disposed adjacent to the first major surface, the first layer of material comprising titanium and having a first thickness; forming a second layer of material disposed adjacent to the first layer of material, the second layer of material comprising nickel-platinum and having a second thickness; exposing the first layer of material and the second layer of material to a temperature in a range from about 650 degrees Celsius through about 700 degrees Celsius; and after the step of exposing, removing any unreacted portions of the first layer of material and the second layer of material.

In another example, a method of forming a semiconductor device, includes providing a region of semiconductor material comprising a first major surface and a second major surface opposite to the first major surface. The method includes providing a trench structure comprising a trench extending into the region of semiconductor material from the first major surface; and a conductive material disposed within the trench and separated from the region of semiconductor material by a dielectric region, wherein the dielectric region is disposed along opposing sidewall surfaces of the trench and disposed along a lower surface of the trench; and the dielectric region comprises a first uppermost surface. The method includes providing a Schottky contact region disposed adjacent to the first major surface and adjacent to the trench structure, wherein providing the Schottky contact region comprises forming a first layer of material disposed adjacent to the first major surface, the first layer of material consisting essentially of titanium and having a first thickness; forming a second layer of material disposed adjacent to the first layer of material, the second layer of material consisting essentially of nickel-platinum and having a second thickness; exposing the first layer of material and the second layer of material to a temperature in a range from about 650 degrees Celsius through about 700 degrees Celsius; and after the step of exposing, removing any unreacted portions of the first layer of material and the second layer of material.

In a further example, a method of forming a semiconductor device comprises providing a region of semiconductor material comprising a first major surface and a second major surface opposite to the first major surface. The method includes providing a trench structure comprising a trench extending into the region of semiconductor material from the first major surface; and a conductive material disposed within the trench and separated from the region of semiconductor material by a dielectric region, wherein the dielectric region is disposed along opposing sidewall surfaces of the trench and disposed along a lower surface of the trench; and the dielectric region comprises a first uppermost surface. The method includes providing a Schottky contact region disposed adjacent to the first major surface and adjacent to the trench structure, wherein providing the Schottky contact region comprises forming a conductive structure, the conductive structure being one of: 1) a layer of material consisting essentially of nickel-chrome disposed adjacent to the first major surface; or 2) a first layer of material consisting essentially of titanium disposed adjacent to the first major surface and a second layer of material disposed adjacent to the first layer of material and consisting essentially of nickel-platinum; exposing the conductive structure to an elevated temperature to form a silicide structure; and after the step of exposing, removing any unreacted portions of the conductive structure.

FIG. 1 illustrates an enlarged partial cross-sectional view of an electronic device 10, a semiconductor device 10, Schottky diode device 10, or trench Schottky rectifier 10 in accordance with one example. In the present example, device 10 includes a region of semiconductor material 11, which includes a major surface 18 and major surface 19, which is opposite to major surface 18. Region of semiconductor material 11 can include a bulk substrate 12, such as an N-type silicon substrate having a resistivity ranging from about 0.001 ohm-cm to about 0.005 ohm-cm. By way of example, substrate 12 can be doped with phosphorous, arsenic, or antimony.

Device 10 further includes a semiconductor layer 14, doped region 14, or doped layer 14, which can be formed in, on, or overlying substrate 12. In one example, semiconductor layer 14 can be an N-type conductivity region or layer, and can be formed using epitaxial growth techniques, ion implantation and diffusion techniques, or other techniques known to those of ordinary skill in the art. In one example, semiconductor layer 14 includes major surface 18 of region of semiconductor material 11. In some examples, semiconductor layer 14 has a dopant concentration less than the dopant concentration of substrate 12. The dopant concentration and/or dopant profile of semiconductor layer 14 can be selected to provide a desired breakdown voltage and a desired forward voltage drop. It is understood that region of semiconductor material 11, semiconductor substrate 12, and/or semiconductor layer 14 can include other types of materials including, but not limited to, heterojunction semiconductor materials, and semiconductor substrate 12 and semiconductor layer 14 can each include different materials. Such materials can include SiGe, SiGeC, SiC, GaN, AlGaN, and other similar materials as known to those of ordinary skill in the art.

Device 10 includes a first trench 21 or termination trench 21 and second trenches 23 or active trenches 23. By way of example, termination trench structure 21 can be disposed in or adjacent to an edge portion of region of semiconductor material 11, and active trenches 23 can be disposed inward from termination trench 21 such that termination trench structure 21 is interposed between the edge portion of region of semiconductor material 11 and active trenches 23. In some examples, termination trench 21 is a continuous trench that completely surrounds active trenches 23. In one example, termination trench 21 extends from major surface 18 into semiconductor layer 14 towards semiconductor substrate 12. In some examples, termination trench 21 can extend into semiconductor substrate 12. In other examples, termination trench 21 can terminate within semiconductor layer 14 thereby leaving a portion of semiconductor layer 14 disposed between a lower extent of termination trench 21 and semiconductor substrate 12. In one example, termination trench 21 includes a dielectric layer 212, a dielectric region 212, or a dielectric structure 212 disposed adjoining sidewall and lower surfaces of termination trench 21 as generally illustrated in FIG. 1.

Dielectric layer 212 defines a lower surface 210 of termination trench 21 at a distance inward from major surface 18. It is understood that lower surface 210 may not be flat, but may have other shapes including, but not limited to curved, rounded, partially-curved, or partially-rounded shapes. In one example, dielectric layer 212 can be a thermal oxide having a thickness in a range from about 0.05 microns to about 0.5 microns. In other examples, dielectric layer 212 can be other types of oxides, nitrides, combinations thereof, or other materials known to those skilled in the art.

In one example, termination trench 21 further includes one or more conductive spacers 217 along sidewall surfaces adjoining dielectric layer 212. In one example, conductive spacers 217 can be a conductive polycrystalline material, such as a doped polysilicon (e.g., N-type or P-Type). In one example, a dielectric layer 219, a dielectric region 219, or a dielectric structure 219 is disposed within termination trench 21. In one example, dielectric layer 219 can be further disposed on or adjacent to a portion of major surface 18 laterally spaced away from active trenches 23 as generally illustrated in FIG. 1. In one example, dielectric layer 219 can be a deposited dielectric material, such as a deposited oxide, a deposited nitride, combinations thereof, or other dielectric materials as known to those skilled in the art. In one preferred example, dielectric layer 219 can be an oxide deposited using a tetra-ethyl-ortho-silicate ("TEOS") source using plasma-enhanced chemical vapor deposition ("PECVD") or low pressure chemical vapor deposition ("LPCVD"), and can have a thickness in a range from about 0.2 microns to about 1.0 micron. In some examples, termination trench 21 can have a width in a range from about 4 microns to about 20 microns. In one example, termination trench 21 can have a width of about 10 microns.

In the present example, device 10 includes active trenches 23 extending from major surface 18 into semiconductor layer 14 towards semiconductor substrate 12. In some examples, active trenches 23 are configured as a plurality of separate trenches. In other examples, active trench 23 can be configured as a continuous trench. In one example, active trenches 23 include a gate dielectric region 222, a gate dielectric layer 222, a dielectric layer 222, a dielectric layer 222, a dielectric region 222, or a dielectric structure 222 disposed adjoining sidewall and lower surfaces of active trenches 23. Dielectric layer 222 defines a lower surface 230 of active trenches 23. It is understood that lower surfaces 230 may not be flat, but can have other shapes including, but not limited to curved, rounded, partially-curved, or partially-rounded shapes. In one example, dielectric layers 222 comprise a thermal oxide having a thickness in a range from about 0.05 microns to about 0.6 microns. In some examples, dielectric layer 212 and dielectric layers 222 can be the same material. In some examples, dielectric layer 212 and dielectric layer 222 can be formed during the same process step.

Active trenches 23 further include a conductive layer 237, a conductive region 237, a gate electrode 237, or a conductive material 237 provided along surfaces adjoining dielectric layer 222. In one example, conductive material 237 can be a conductive polycrystalline material, such as a doped polysilicon. In some examples, active trenches 23 can have a width in a range from about 0.1 microns to about 0.6 microns. In one example, active trenches 23 can have a width of about 0.2 microns to about 1.0 micron. By way of example, the width of active trenches 23 can be modified depending on the breakdown voltage rating of device 10. In some examples, device 10 can have an active trench 23 width to termination trench 21 width ratio in a range from about 0.005 to about 0.125. In other examples, device 10 can have an active trench 23 width to termination trench 21 width ratio less than about 0.03.

In some examples, dielectric layers 222 comprise uppermost surfaces 222A and 222B that are intentionally shaped or formed having a profile in a cross-sectional view where a major portion or a substantial portion (e.g., at least 50% or more) of uppermost surfaces 222A and 222B reside above a generally horizontal plane defined by major surface 18 of region of semiconductor material 11 (or semiconductor layer 14) prior to the formation of Schottky contact regions 26, which are described next.

Device 10 further includes Schottky contact regions 26, Schottky barrier structures 26, contact regions 26, conductive layers 26, conductive region or regions 26, or conductive material 26 disposed adjoining portions of major surface 18. In some examples, Schottky contact regions 26 also can be disposed adjoining upper surface portions of conductive material 237 and upper surface portions of at least one of conductive spacers 217. Conductive material 26 comprises materials capable of forming a silicide with region of semiconductor material 11, and configured to provide a Schottky barrier with region of semiconductor material 11 or semiconductor layer 14.

Figure 2:
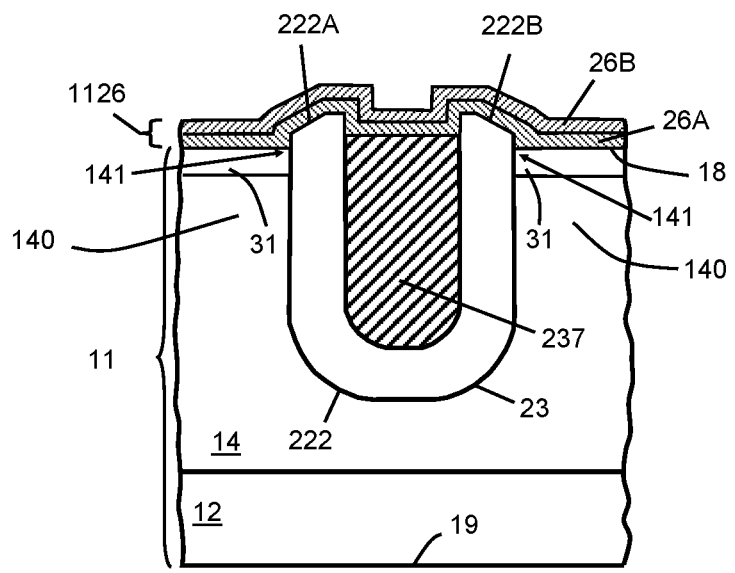
FIG. 2 illustrates a partial cross-sectional view of an example of a semiconductor device in accordance with the present description.

In accordance with the present description, Schottky contact regions 26 comprise a combination of conductive materials configured to provide a predetermined Schottky barrier height in a desired range. More particularly, the combination of metal materials is selected and processed to provide a predetermined Schottky barrier height in a range from about 0.45 eV to about 0.85 eV. In one preferred example, Schottky contact regions 26 comprise a combination of titanium (Ti) and an alloy of nickel-platinum (NiPt), with various platinum atomic weight percentages, for example, from about 1% to about 80%, with 5% being selected in some examples. In accordance with one preferred example as illustrated in FIG. 2, which is a partial cross-sectional view of device 10 at an earlier step in fabrication, Schottky contact regions 26 initially comprise a layer 26A of titanium deposited overlying major surface 18 followed by a layer 26B of nickel-platinum deposited overlying layer 26A of titanium. Layers 26A and 26B may be referred together as a conductive structure 1126.

In some examples, layer 26A of titanium is formed using sputtering techniques, and has an as-formed thickness in a range from about 200 Angstroms through about 1000 Angstroms. In other examples, layer 26A of titanium has an as-formed thickness in a range from about 300 Angstroms through about 800 Angstroms. In further examples, layer 26A of titanium has an as-formed thickness in a range from about 400 Angstroms through about 600 Angstroms. In further examples, it is preferred that the as-formed (i.e., before silicidation) thickness ratio of titanium to nickel-platinum be greater than or equal to about 1.33 to 1 (1.33:1). In other preferred examples, the as-formed thickness ratio be greater than or equal to about 2:1. In some preferred examples, the as-formed thickness ratio is greater than or equal to 3:1. In further preferred examples, the as-formed thickness ratio is about 6:1.

In some examples, layer 26B of nickel-platinum is formed using sputtering techniques, and has a thickness in a range from about 50 Angstroms through 400 Angstroms. In other examples, layer 26B of nickel-platinum has a thickness in a range from about 100 Angstroms through about 350 Angstroms. In accordance with the present description, after layer 26B is formed, layers 26A and 26B are exposed to an elevated temperature to form a silicide layer with region of semiconductor material 11. More particularly, conductive material 26 preferably is exposed to or annealed at a temperature in a range from 650 degrees Celsius through about 700 degrees Celsius in the presence of a gas that does not readily form reaction products with other materials, such as those used in device 10. By way of example, the annealing step is done in nitrogen. In one example, a rapid thermal annealing process can be used with conductive material 26 exposed to the predetermined temperature between about 650 degrees Celsius and about 700 degrees Celsius for a time period of about 30 seconds to about 45 seconds. It was found through experimentation that temperatures in excess of about 700 degrees Celsius can result in stress at the upper corners 141 of the mesa regions 140 of device 10 adjacent to dielectric layers 222 of active trenches 23, which can result in diminished electrical performance.

After the anneal step is completed, the annealed material is exposed to a stripping or removal process to remove any unreacted material to Schottky contact regions 26 for device 10. In some examples, the annealed material is exposed to a wet chemical bath comprising sulfuric acid and hydrogen peroxide (SPM). In some examples, the wet chemical bath is heated to temperatures in excess of 100 degrees Celsius. In other examples, a wet chemical bath heated to a temperature of about 150 degrees Celsius is used to remove unreacted material to provide Schottky contact regions 26. In further examples, a mixture of nitric acid and hydrochloric acid (for example, aqua regia) or ammonium peroxide can be used to remove unreacted material.

In some examples, device 10 may also include one or more doped regions 31, which can be either N-type or P-type provided adjacent to major surface 18 and adjacent to Schottky contact regions 26. In one example, doped regions 31 can be deeper doped regions having a dopant concentration configured to provide clamping action in reverse bias conditions to improve the dynamic robustness of device 10. In other examples (as illustrated in FIG. 2), doped region 31 can be a shallower doped region that extends laterally across semiconductor layer 14 adjacent major surface 18, and can have a dopant concentration configured to further adjust barrier height(s) for device 10. Doped regions 31 can be provided using ion implantation and annealing techniques, epitaxial growth techniques, or other doping techniques as known to those skilled in the art. In one example, doped regions 31 extend into region of semiconductor material 11 so as to be deeper than the bottoms of active trenches 23 when doped regions 31 are used for dynamic clamping or conduction tuning.

In other examples, doped regions 31 can be provided in only some mesa regions and not in others to provide different Schottky barrier heights between mesa regions. When doped region 31 are used for further barrier height adjustment, doped regions 31 typically have depth less than about 1.0 micron.

In some examples, device 10 may include a deeper doped region (not illustrated) provided below doped regions 31 to provide for conduction tuning of the device. This may also be done by providing, for example, a graded dopant profile within semiconductor layer 14 by using graded epitaxial growth techniques or by using multiple ion implants.

In some examples, device 10 may include a doped region 30 or an edge seal region 30 disposed between termination trench 21 and the edge or periphery of region of semiconductor material 11. In some examples, doped region 30 comprises the same conductivity type as semiconductor layer 14, which in the present example is N-type, and can be formed using ion implantation and annealing processes. In some examples, doped region 30 is heavily doped to provide low contact resistance to conductive layer 44. Doped region 30 can be P-type when semiconductor layer 14 is P-type. Doped region 30 can be configured to reduce leakage current issues caused by, for example, edge defects. It is understood that doped region 30 may not be included in some examples. In some examples, a Schottky contact region 26 may also be disposed adjoining doped region 30 adjacent to major surface 18 of region of semiconductor 11 as generally illustrated in FIG. 1.

A conductive layer 44 can be formed overlying major surface 18 and a conductive layer 46 can be formed overlying major surface 19. Conductive layers 44 and 46 can be configured to provide electrical connection between device 10 and a next level of assembly, such as a semiconductor package structure or substrate. In accordance with the present example, conductive layer 44 is electrically connected to Schottky contact regions 26. In one example, conductive layer 44 can be titanium/titanium-nitride/aluminum-copper or other related or equivalent materials known by one of ordinary skill in the art and is configured as first current carrying electrode or terminal 440 or an anode electrode 440 for device 10. In one example, conductive layer 46 can be a solderable metal structure such as titanium-nickel-silver, chromium-nickel-gold, or other related or equivalent materials known by those skilled in the art. In the example illustrated, conductive layer 46 provides a second current carrying electrode or terminal 460 or a cathode electrode 460 for device 10.

In accordance with the present example, Schottky contact regions 26 comprising titanium and nickel-platinum as described herein were found through experimentation to provide Schottky barrier heights in a desired range from about 0.5 eV to about 0.8 eV with reduced stress in regions of device 10 proximate to the corner regions 141 of mesa regions 140 between active trenches 23.

Figure 3:
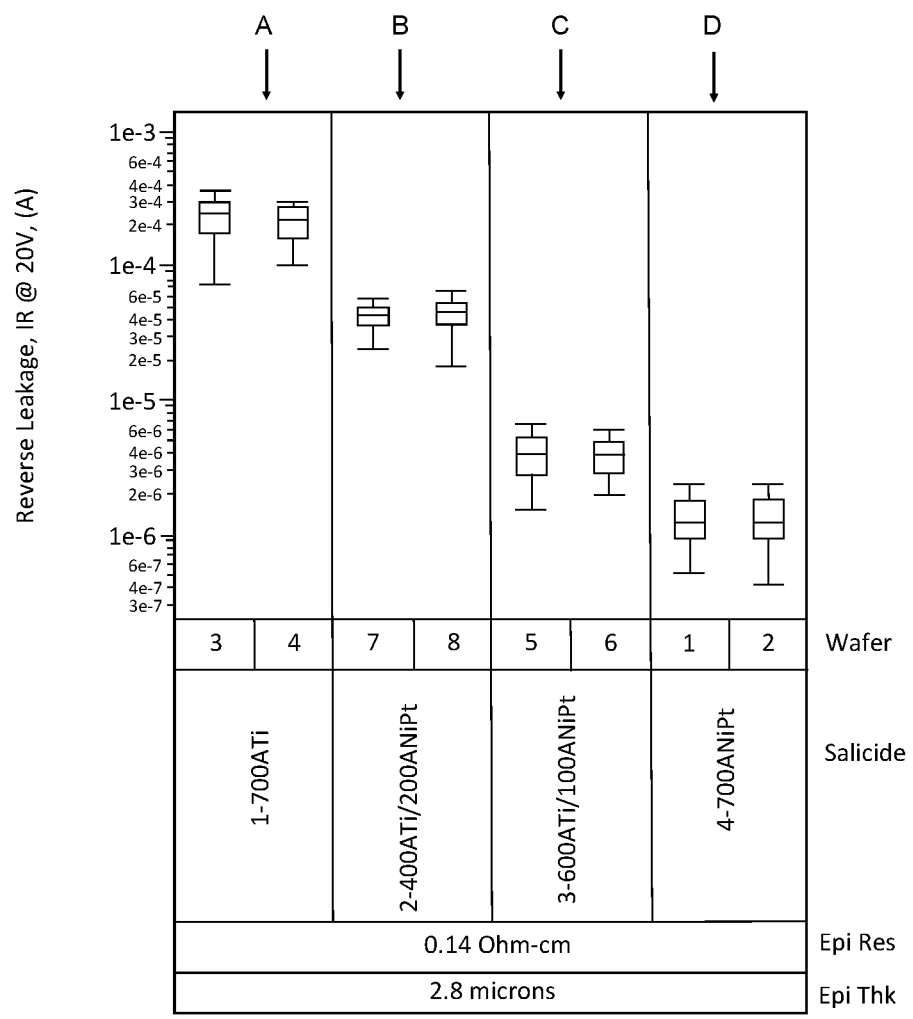
FIGS. 3 and 4 are charts illustrating comparative results of example semiconductor devices in accordance with the present description and prior semiconductor devices.
Figure 4:
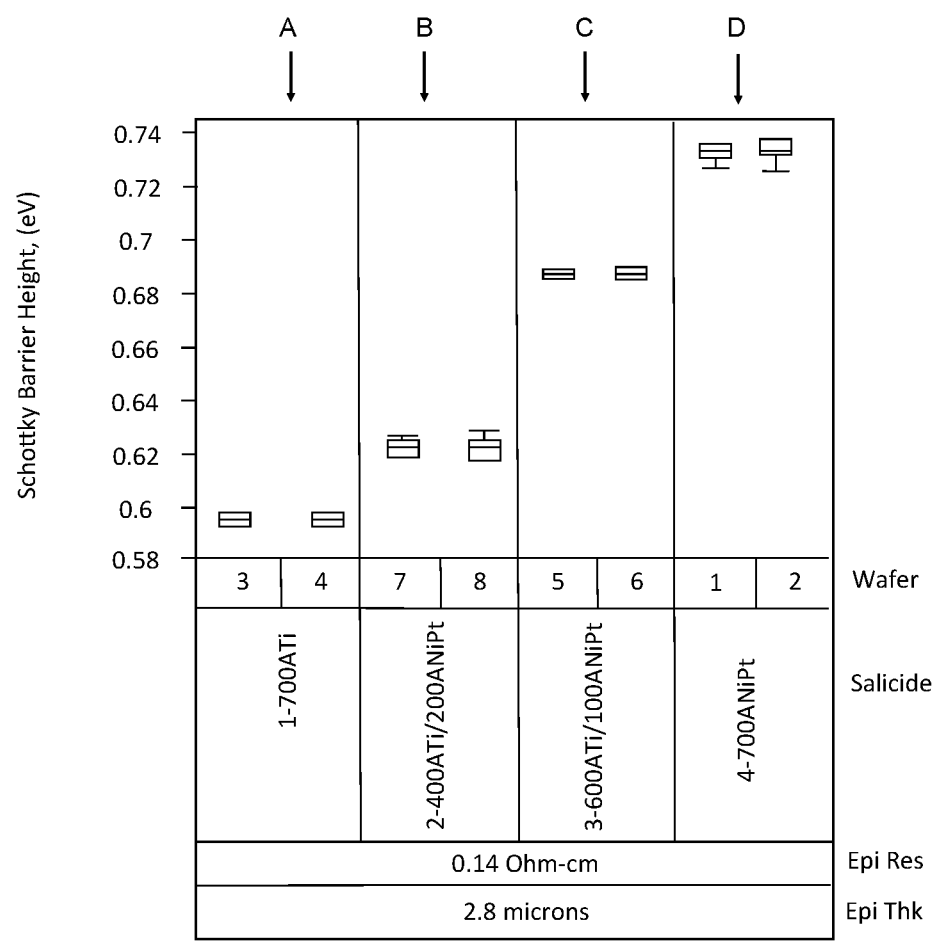

FIGS. 3 and 4 are box and whisker charts illustrating experimental results comparing two variations of device 10 in accordance with the present description with a prior device using a titanium only Schottky barrier structure and a prior device using a nickel-platinum only Schottky barrier structure. FIG. 3 compares reverse leakage data and FIG. 4 compares Schottky barrier height data. In the analysis, semiconductor layer 14 comprised an epitaxially formed layer having a thickness of about 2.8 microns and a resistivity (N-type) of about 0.14 Ohm-cm. In both FIGS. 3 and 4, column A is data from two wafers of a prior device with a Schottky barrier structure formed from a layer of titanium having an as-formed thickness of 700 Angstrom; column B is data from two wafers of a device 10 in accordance with the present description having a Schottky barrier structure 26 formed from a layer of titanium having an as-formed thickness of about 400 Angstroms and a layer of nickel-platinum (5% Pt) having an as-formed thickness of about 200 Angstroms; column C is data from two wafers of a device 10 in accordance with the present description having a Schottky barrier structure 26 formed from a layer of titanium having an as-formed thickness of about 600 Angstroms and a layer of nickel-platinum having an as-formed thickness of about 100 Angstroms; and column D is data from two wafers of a prior device with a Schottky barrier structure formed from a layer of nickel-platinum (5% Pt) having an as-formed thickness of 700 Angstroms.

As this data illustrates, device 10 in accordance with the present description provides predetermined Schottky barrier heights within the range of 0.45 eV to 0.85 eV. In particular, the examples illustrated provide barrier heights in a range from about 0.62 eV to about 0.68 eV with acceptable leakage current results.

In addition, the authors of the present description found at least one unexpected result through their experimentation. More particularly, the authors found that a thicker titanium layer for layer 26A and a thinner nickel-platinum layer 26B (e.g., the column C structure) actually produced a Schottky barrier height that is closer to the column D device having a nickel-platinum only Schottky barrier structure. As the data shows, the column B device, which has less titanium and more nickel-platinum than the column C devices, is closer to the titanium only Schottky barrier structure of column A. The authors assert that had one of ordinary skill in the art considered the author's invention at the time the authors conceived it, one of ordinary skill in the art would have predicted that a thicker titanium film would have been closer to the characteristics of a titanium only Schottky barrier structure. Through their work, the authors discovered that this is not the case, which was unexpected.

It is believed that a thicker titanium layer forms a larger titanium grain boundary, which allows more nickel-platinum silicide to form on the surface, resulting in a higher barrier height. This behavior is opposite to what is expected from a typical mixture of titanium and nickel-platinum because titanium has a lower barrier height than nickel-platinum. It is also observed that thinner titanium film thickness results in less nickel-platinum silicidation, which leads to lower barrier height, which is more in-line with expected results.

In addition, Table 1 provides further comparison results for a device 10 in accordance with the present description having a titanium/nickel-platinum (5% Pt) Schottky barrier structure against a comparable planar device having a nickel-platinum Schottky barrier structure, an insulated trench gated device with a nickel-platinum (5% Pt) Schottky barrier structure, and an insulated trench gated device with a titanium Schottky barrier structure. These results show that device 10 has, among other things, improved VF performance and improved power dissipation performance compared to the planar Schottky device and the nickel-platinum (5%) only device; and has improved reverse leakage current (IR) performance compared to the titanium only device.

TABLE 1

Comparison Electrical Data for Device 10

| | Planar Schottky | NiPt (5%) Insulated trench gated Schottky device | 600Ti/200NiPt Insulated trench gated Schottky device | Ti Insulated trench gated Schottky device |
|---|---|---|---|---|
| Die Size | 330 um × 260 um | 330 um × 260 um | 330 um × 260 um | 330 um × 260 um |
| BVR @ 1 mA | 50 V | 48 V | 48 V | 48 V |
| IR @ 10 V | 0.78 uA | 0.17 uA | 1.2 uA | 20.1 uA |
| IR @ 30 V | 2.3 uA | 1.1 uA | 2.4 uA | 50 uA |
| VF @ 500 mV | 780 mV | 580 mV | 530 mV | 445 mV |
| Calculated Power Dissipation (PD) | 27.7 mW | 20.5 mW | 18.9 mW | 17.2 mW |
| PD Comparison | 100% | 74% | 68% | 62% |

Figure 5:
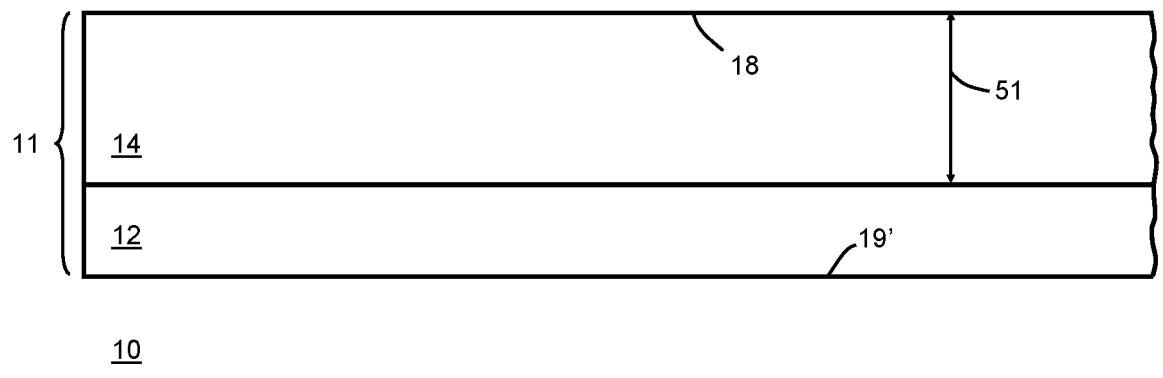
FIGS. 5-15 are partial cross-sectional views illustrating an example method of fabricating a semiconductor device in accordance with the present description.

Turning now to FIGS. 5-15, an example method for forming a semiconductor device, such as device 10, will now be described. In FIG. 5, which is a partial cross-section view of device 10 at an early step in fabrication, region of semiconductor material 11 is provided having substrate 12 with major surface 19' and semiconductor layer 14 with major surface 18. In one example, substrate 12 can be an N-type silicon substrate having a resistivity ranging from about 0.001 ohm-cm to about 0.005 ohm-cm and can be doped with arsenic. In one example, semiconductor layer 14 is provided using epitaxial growth techniques and can be provided having a thickness 51 in a range from about 1.0 microns to about 15 microns. In some examples, semiconductor layer 14 has a thickness in a range from about 1 micron to about 15 microns, and a dopant concentration in a range from about $5.0 \times 10^{13}$ atoms/cm$^3$ to about $5.0 \times 10^{17}$ atoms/cm$^3$. In some examples, semiconductor layer 14 is N-type and doped with phosphorous.

More particularly, in an example for a 20 volt device, semiconductor layer 14 has a thickness 51 from about 1.5 microns to about 2.5 microns and a dopant concentration in a range from about $1.0 \times 10^{16}$ atoms/cm$^3$ and about $1.0 \times 10^{17}$ atoms/cm$^3$. In an example for a 30 volt device, semiconductor layer 14 has a thickness 51 from about 2.25 microns to about 3.25 microns and a dopant concentration in a range from about $1.5 \times 10^{16}$ atoms/cm$^3$ and about $8.0 \times 10^{16}$ atoms/cm$^3$. In an example for a 40 volt device, semiconductor layer 14 has a thickness 51 from about 2.7 microns to about 4.5 microns and a dopant concentration in a range from about $1.0 \times 10^{16}$ atoms/cm$^3$ and about $6.0 \times 10^{16}$ atoms/cm$^3$.

In some examples, semiconductor layer 14 has a substantially uniform dopant profile along or over its thickness 51. In other examples, semiconductor layer 14 has a non-uniform dopant profile along or over thickness 51. For example, semiconductor layer 14 can have a graded dopant profile where the dopant concentration can decrease from major surface 18 over thickness 51 towards substrate 12. In another example, the dopant concentration can increase over thickness 51 from major surface 18 towards substrate 12. In yet another example, the dopant concentration can first increase and then decrease over thickness 51 from major surface 18 towards substrate 12.

Figure 6:
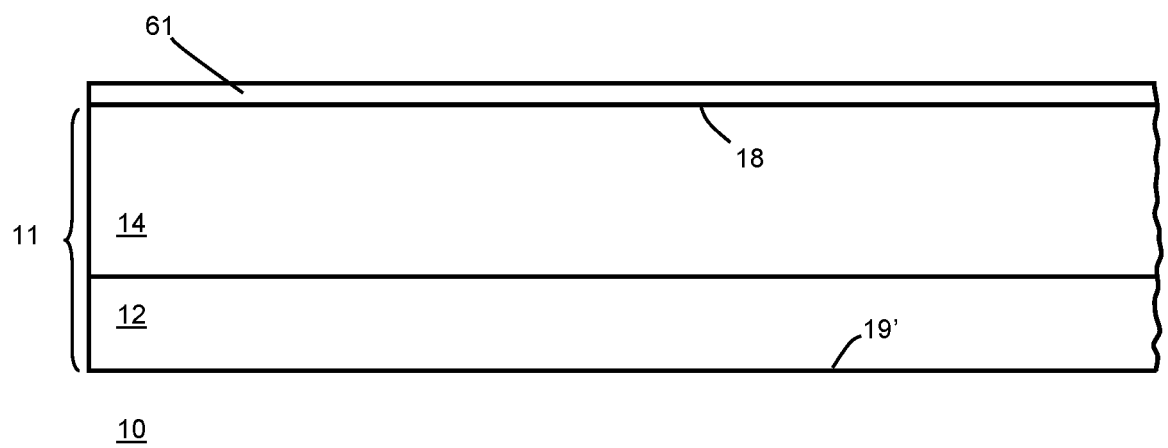
Figure 7:
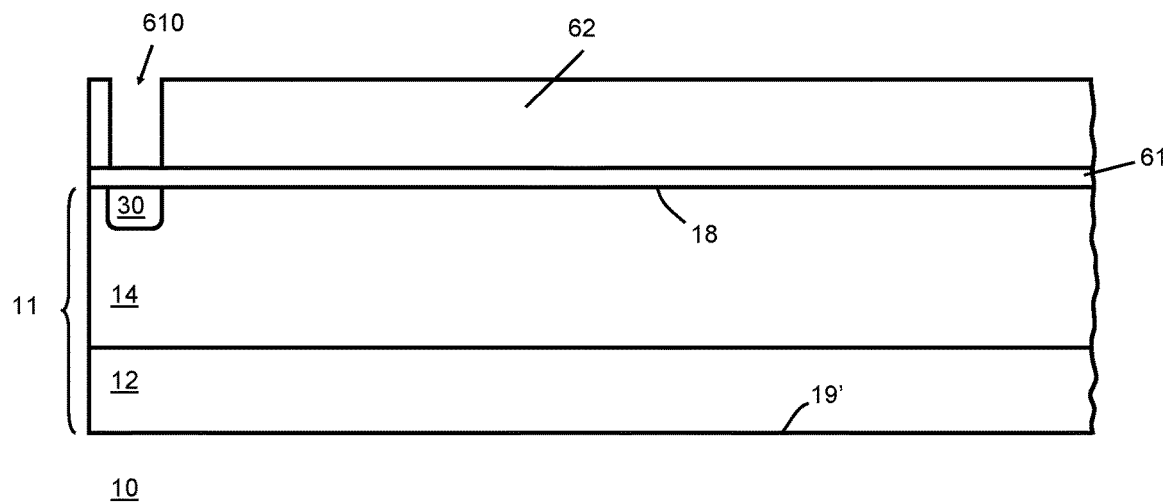

FIG. 6 illustrates device 10 after additional processing. In one example, the structure is subjected to a cleaning process and then a layer 61 can be provided adjacent to or overlying major surface 18. In some examples, layer 61 can be a dielectric material, such as an oxide or another material configured for providing a hard mask. In one example, layer 61 is a thermal oxide having a thickness in a range from about 0.03 microns to about 0.5 microns. A masking layer 62 is then provided disposed overlying layer 61 as illustrated in FIG. 7. In one example, masking layer 62 can be a photoresist layer patterned to provide an opening 610 configured in a desired pattern to provide for doped region 30 or edge seal region 30. In one example, doped region 30 is then provided using ion implantation techniques or other doping techniques. In some examples, doped region 30 is provided using an arsenic ion implant with an implant dose of about $1.0 \times 10^{15}$ atoms/cm$^2$ to about $7.0 \times 10^{15}$ atoms/cm$^2$ and an implant energy of about 100 keV. In some examples, masking layer 62 is then removed. The implanted dopant can be annealed at this step in the process, and/or it can be annealed at a subsequent process step. In some examples, doped region 30 is not used.

Figure 8:
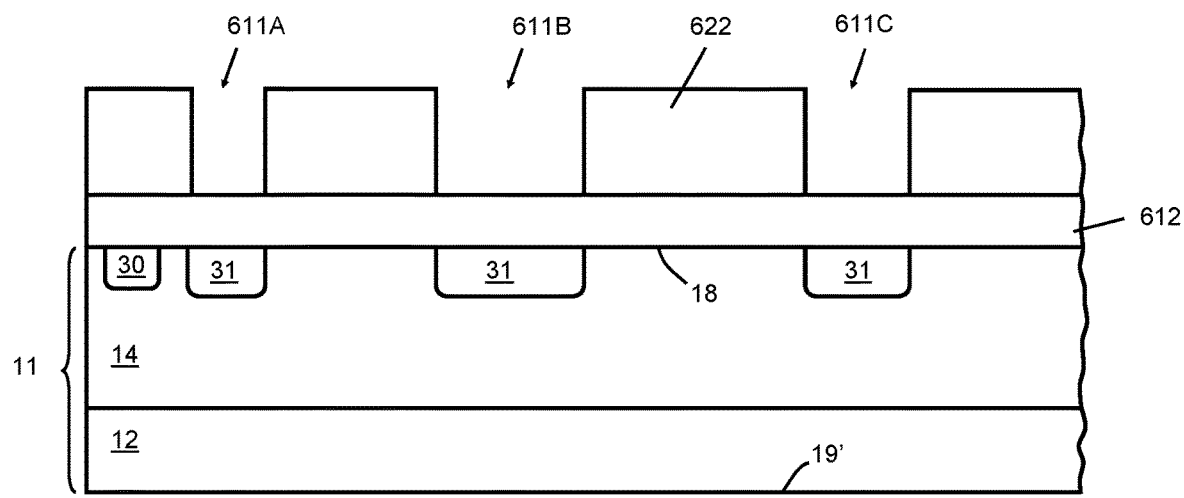

FIG. 8 illustrates device 10 after further processing. In one example, the structure is cleaned and a layer 612 is provided overlying major surface 18. In some examples, layer 612 can be a dielectric layer comprising a thermal oxide having a thickness in a range from about 0.15 microns to about 0.5 microns. In some examples, layer 612 has a thickness that allows for dopants to be effectively or desirably implanted through the layer 612 into semiconductor layer 14. Next, a masking layer 622 is provided disposed overlying layer 612. In one example, masking layer 622 comprises a photoresist layer patterned to provide openings 611A, 611B, and 611C for doped regions 31, which can have the same or different dimensions. In example, doped regions 31 are then provided using ion implantation techniques. In some examples, doped regions 31 are provided using a boron ion implant with an implant does of about $6.0 \times 10^{12}$ atoms/cm$^2$ to about $1.0 \times 10^{13}$ atoms/cm$^2$ and an implant energy of 300 keV. In some examples, masking layer 622 is then removed. The implanted dopant can be annealed at this step in the process, and/or it can be annealed at a subsequent process step. In some examples, doped regions 31 are not used.

Figure 9:
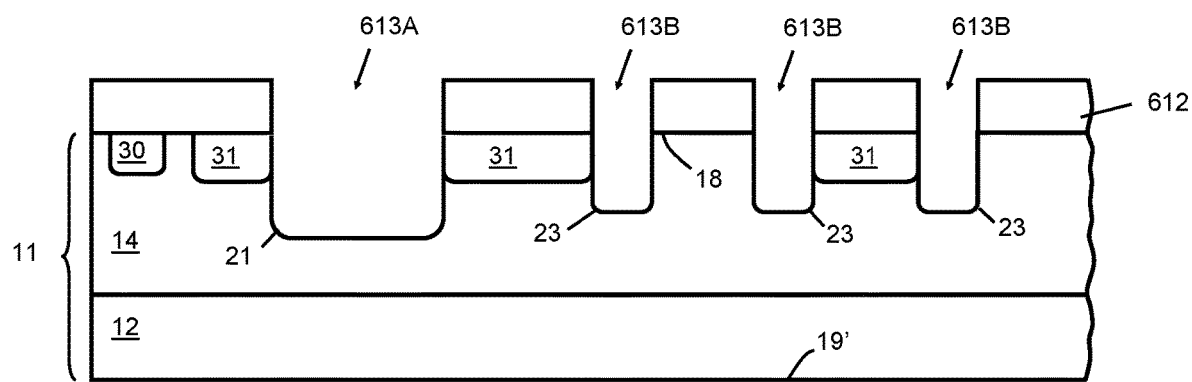

FIG. 9 illustrates device 10 after still further processing. In one example, a masking layer (not shown), such as a patterned photoresist layer, is provided over layer 612. The masking layer is then used to form openings 613A and 613B in layer 612 exposing, for example, portions of major surface 18 of region of semiconductor material 11. In some examples, opening 613A can have a width in a range from about 4 microns to about 20 microns, and openings 613B can have a width in a range from about 0.1 microns to about 2 microns.

In some examples, a single removal step is used to form both termination trench 21 and active trenches 23, which can have different depths. In some examples, termination trench 21 is deeper than active trenches 23. In other examples, active trenches 23 are deeper than termination trench 21. In one example, termination trench 21 and active trenches 23 can be etched using plasma etching techniques with a fluorocarbon chemistry or a fluorinated chemistry (for example, $SF_6/O_2$) or other chemistries or removal techniques as known to those skilled in the art. Active trenches 23 can have a depth in a range from about 0.4 microns to about 4.0 microns. Termination trench 21 can have a depth in a range from about 0.8 microns to about 10.0 microns.

Figure 10:
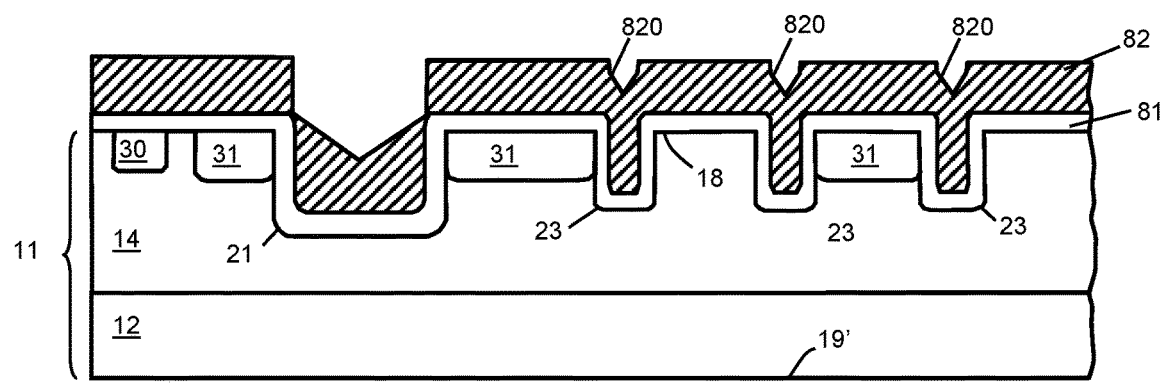

FIG. 10 illustrates device 10 after additional processing. In one example, a layer 81 is formed along surfaces of termination trench 21, surfaces of active trenches 23, and major surface 18. In one example, layer 81 is a dielectric material, such as an oxide, a nitride, tantalum pentoxide, titanium dioxide, barium strontium titanate, high k dielectric materials, combinations thereof, or other related or equivalent materials known those skilled in the art. In one example, layer 81 can be a dry oxide having a thickness in a range from about 0.05 microns to about 1.0 micron. In some examples, layer 81 has a thickness of about 0.4 microns. More particularly, the thickness of layer 81 is selected to leave a gap between adjacent surfaces of layer 81 within active trenches 23 as generally illustrated in FIG. 10. In other examples, the sidewall surfaces of termination trench 21 can be sloped to provide further field shaping effects. In other examples, portions of layer 612 can remain adjacent major surface 18 between termination trench 21 and the outermost edge of region of semiconductor material 11.

Next, a conductive layer 82 is provided adjacent to or overlying layer 81. In some examples, conductive layer 82 comprises doped polysilicon provided using LPCVD or PECVD processing techniques. In one example, conductive layer 82 is provided using a silane source gas doped with an N-type dopant, such as phosphorous. In some examples, conductive layer 82 has a thickness in a range from about 0.6 microns to about 2.0 microns, and has a dopant concentration of $1.0 \times 10^{20}$ atoms/cm$^3$ or more. One artifact of the present method is that notches 820 are formed in the top surface of conductive layer 82 disposed above active trenches 23. It was found through experimentation that notches 820 are a factor in defining the shape of uppermost surfaces 222A and 222B of dielectric regions 222. In prior methods, a blanket or unmasked etch-back step was used to planarize conductive layer 82 all the way back to layer 81. That is, the blanket etch-back step was done until conductive layer 82 was cleared or removed from layer 81 above the horizontal portions of major surface 18. The author's experimentation found that among other things, unless accounted for, notches 820 can result in the uppermost surfaces of dielectric regions 222 to have a downward sloping shape from edges 141 of mesas 140 towards conductive material 237. This downward sloping shape resulted in, among other things, a semiconductor device having increased leakage and reduced breakdown voltage performance.

Figure 11:
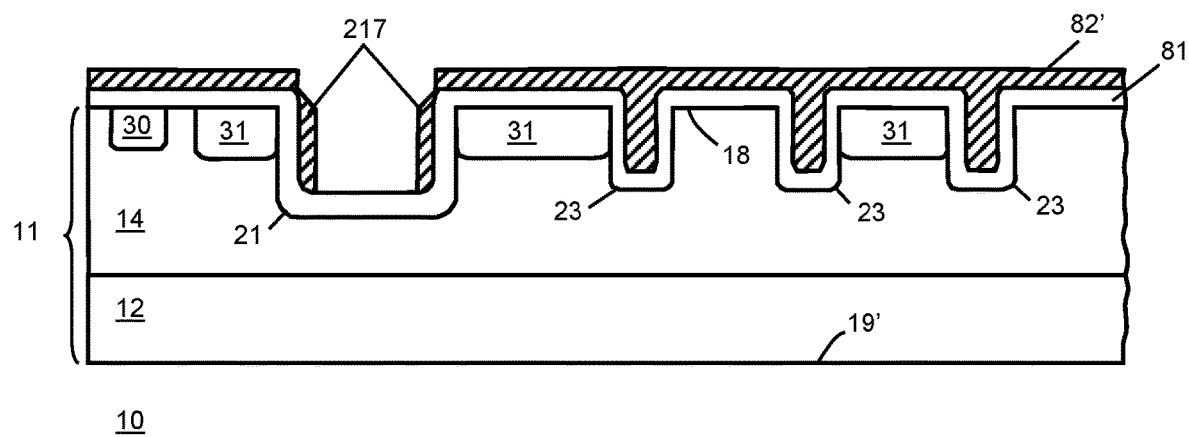
Figure 12:
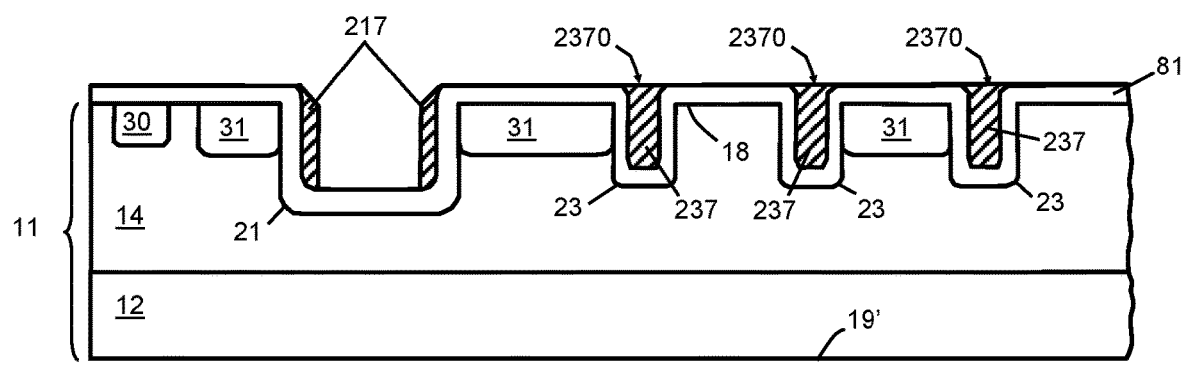

FIG. 11 illustrates device 10 after further processing. In accordance with the present example, up to about 75% to 85% of conductive layer 82 is removed using the blanket etch process to provide conductive layer 82'. In one example, a wet etch can be used. In other examples, a dry etch can be used. In some examples, about 0.14 microns to about 0.16 microns of conductive layer 82 remains after the blanket etch process. In one preferred example, about 0.15 microns of conductive layer 82 remains after the blanket etch process. In some examples, this thickness was found to provide better electrical performance for device 10 including lower leakage and improved breakdown voltage. Because of the larger width of termination trench 21, in some examples the portion of conductive layer 82 at the bottom of termination trench 21 can clear or etch away thereby leaving conductive spacers 217 proximate to sidewall surfaces of termination trench 21 as generally illustrated in FIG. 11. In a next process step, the remaining 15% to 25% of conductive layer 82 is removed using chemical mechanical planarization (CMP) techniques using layer 81, in some examples, as a stop layer to provide the intermediate structure illustrated in FIG. 12.

In some examples, a remaining portion of conductive layer 82 is pre-cleaned prior to the CMP process to remove any unwanted, residual, native, or remaining film(s) on conductive layer 82 that would impede the CMP process. One result from this added step is that portions of conductive layer 82 (which are left within active trenches 23 to provide conductive material 237) can have a flared-out portion 2370 at the upper portion of conductive material 237 proximate to active trenches 23. In the previous method, conductive material 82 was recessed below the upper surface of layer 81 because of etch control or required over-etching. In other examples, a first portion of conductive layer 82 is removed using CMP, preferably below notches 820, and then a blanket etch is used to remove second or remaining portion of conductive layer 82 back to layer 81.

Figure 13:
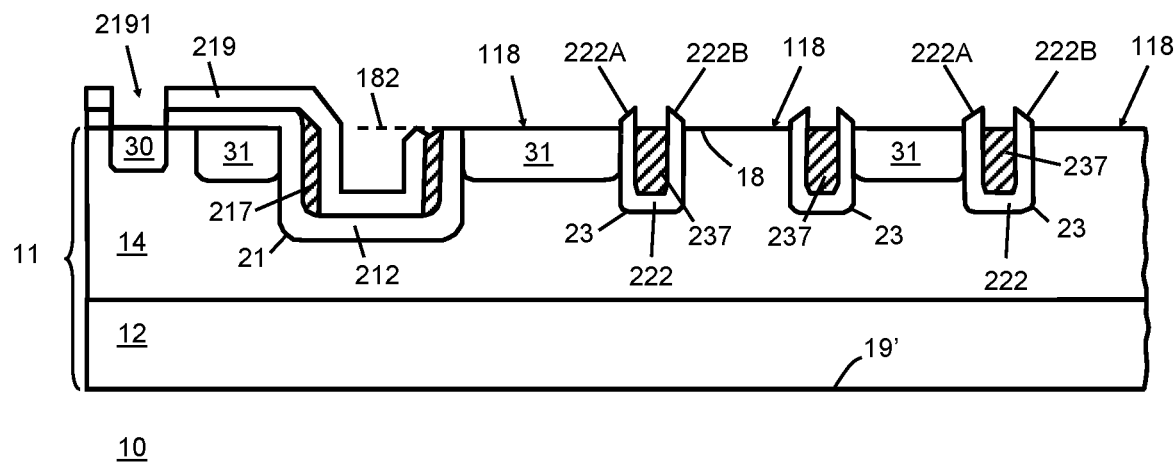

FIG. 13 illustrates device 10 after still further processing. In some examples, a layer of material is provided adjacent major surface 18. In one example, the layer of material can be a TEOS oxide deposited using a PECVD process or an LPCVD process, and can have thickness in a range from about 0.35 microns to about 0.7 microns. Next, a contact masking step and removal step can be used to leave a portion of the layer of material within termination trench 21 to provide dielectric layer 219. The masking and removal steps can further remove portions of layer 81 from the active region of device 10 to expose portions of major surface 18 to provide contact regions 118 and to provide an opening 2191 to doped region 30. This step provides dielectric layer 212 within termination trench 21 and dielectric layers 222 within active trenches 23. The masking and removal steps can also remove portions of conductive material 237 within active trenches 23 to provide the upper surfaces of conductive material 237 at a desired location within active trenches 23.

In some examples, flared-out portions 2370 beneficially result in all or substantially all of uppermost surfaces 222A and 222B to be above a horizontal plane 182 with respect to major surface 18 after the masking and removal step. In other examples, the mask used to provide contact regions 118 is modified to protect portions of layer 81 proximate to active trenches 23 to provide other shapes for uppermost regions 222A and 222B. This can be combined with removal steps, such as selective etching, directional milling or etching, or anisotropic etching to provide the desired shapes of uppermost regions 222A and 222B. The resulting shapes of uppermost surfaces 222A and 222B of dielectric regions 222 provide device 10 with improved performance and reliability.

Figure 14:
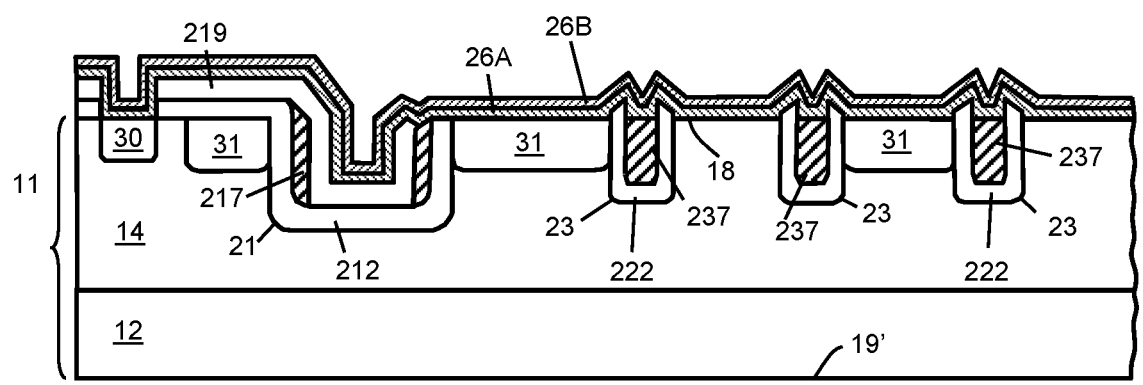

FIG. 14 illustrates device 10 after additional processing in accordance with the present description where layer 26A of conductive material is provided overlying major surface 18 and layer 26B of conductive material is provided overlying layer 26A. More particularly, layer 26A makes direct physical contact to region of semiconductor material 11 adjacent to major surface 18.

In some examples, as-formed layer 26A comprises titanium formed using sputtering techniques. In other examples, as-formed layer 26A consists essentially of titanium formed using sputtering techniques. In further examples, as-formed layer 26A consists of titanium formed using sputtering techniques. In some examples, as-formed layer 26B comprises nickel-platinum (e.g., 5% Pt; 15% Pt; 60% Pt) formed using sputtering techniques. In other examples, as-formed layer 26B consists essentially of nickel-platinum (e.g., 5% Pt; 15% Pt; 60% Pt) formed using sputtering techniques. In further examples, as-formed layer 26B consists of nickel-platinum (e.g., 5% Pt; 15% Pt; 60% Pt) formed using sputtering techniques. It is understood that other deposition or formation techniques as known to those skilled in that art can be used to form or provide layers 26A and 26B.

In some examples, layer 26A has an as-formed thickness in a range from about 200 Angstroms through about 1000

Angstroms. In other examples, layer 26A has an as-formed thickness in a range from about 300 Angstroms through about 800 Angstroms. In further examples, layer 26A has an as-formed thickness of about 400 Angstroms through about 600 Angstroms.

In some examples, layer 26B has an as-formed thickness in a range from about 50 Angstroms through 400 Angstroms. In other examples, layer 26B has an as-formed thickness in a range from about 100 Angstroms through about 350 Angstroms. In one preferred example, layer 26A has an as-formed thickness of about 600 Angstroms and layer 26B has an as-formed thickness of about 100 Angstroms. In another preferred example, layer 26A has an as-formed thickness of about 400 Angstroms and layer 26B has an as-formed thickness of about 200 Angstroms. In further examples, it is preferred that the as-formed (i.e., before silicide is formed) thickness ratio of titanium to nickel-platinum be greater than or equal to about 1.33:1. In other preferred examples, the as-formed thickness ratio be greater than or equal to about 2:1. In some preferred examples, the as-formed thickness ratio be greater than or equal to about 3:1. In further preferred examples, it is preferred that the as-formed thickness ratio be about 6:1.

In other examples, an alloy consisting essentially of titanium-nickel-platinum can be provided in a desired ratio as a sputtering target. In the alloy approach, a region of conductive material comprising titanium and nickel-platinum is provided.

After layer 26B is formed, the structure is exposed to an elevated temperature to react layers 26A, 26B, and region of semiconductor material 11 to form silicide layers or silicide regions. Layers 26A and 26B also react with exposed portions of conductive material 237 and the innermost one of conductive spacers 217 to form silicides with these portions as well. More particularly, device 10 preferably is exposed to a temperature in a range from about 650 degrees Celsius through about 700 degrees Celsius in the presence of presence of a gas that does not readily form reaction products with other materials, such as those used in device 10. By way of example, the anneal step is done in presence of nitrogen. In one example, a rapid thermal annealing process can be used with layers 26A and 26B exposed to one or more predetermined temperatures between about 650 degrees Celsius and about 700 degrees Celsius for a time period of about 30 seconds to about 45 seconds. It was found through experimentation that temperatures in excess of about 700 degrees Celsius can result in stress at the upper corners 141 of the mesa regions 140 of device 10 adjacent to dielectric layers 222 of active trenches 23, which can result in diminished electrical performance. In other examples, a furnace anneal can be used.

Figure 15:
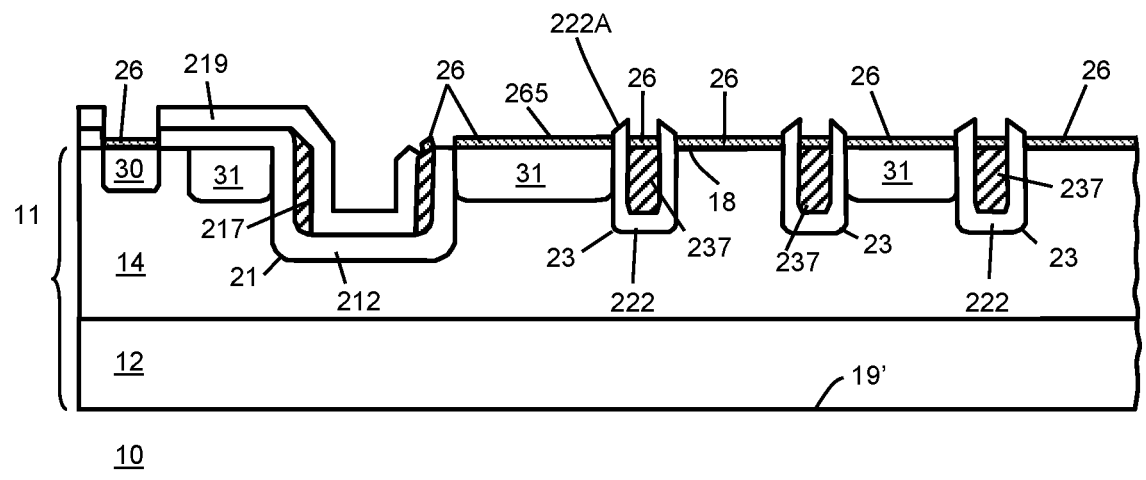

After the anneal step is completed, the annealed material is exposed to a stripping process remove any unreacted material to Schottky contact regions 26 for device 10. In some examples, the annealed material is exposed to a wet chemical bath comprising sulfuric acid and hydrogen peroxide (SPM). In some examples, the wet chemical bath is heated in excess of 100 degrees Celsius. In other examples, a wet chemical bath heated to a temperature of about 150 degrees Celsius is used to remove unreacted material to provide Schottky contact regions 26 as illustrated in FIG. 15. As illustrated in FIG. 15 upper surface 222A of dielectric region 222 is disposed above an upper surface 265 of Schottky contract regions 26.

In subsequent steps, conductive layer 44 is provided overlying major surface 18 as illustrated in FIG. 1. In some examples, conductive layer 44 can be titanium/titanium-nitride/aluminum-copper or other related or equivalent materials known to those skilled in the art and is configured as first current carrying electrode or terminal 440 or an anode electrode 440 for device 10. Next, substrate 12 can be thinned to decrease its thickness using, for example, a grinding process to provide major surface 19. Conductive layer 46 can then be provided on major surface 19 as described and illustrated in FIG. 1. In some examples, conductive layer 46 can be a solderable metal structure such as titanium-nickel-silver, chromium-nickel-gold, or other related or equivalent materials known by those skilled in the art. In the example illustrated, conductive layer 46 provides a second current carrying electrode or terminal 460 or a cathode electrode 460 for device 10.

One additional advantage of the present description is that a variety of Schottky barrier heights can be provided using a manufacturing facility with only two sputtering chambers, which saves on manufacturing upfront costs and ongoing expenses with maintenance and consumables.

Figure 16:
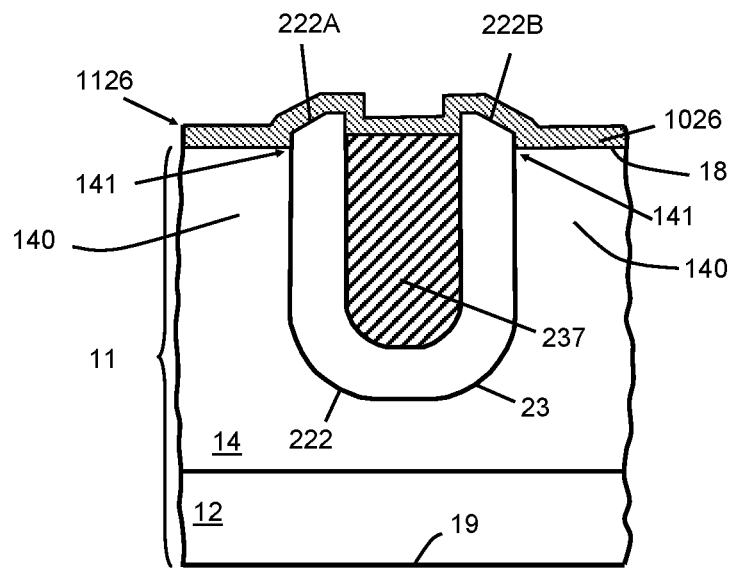
FIG. 16 illustrates a partial cross-sectional view of an example of a semiconductor device in accordance with the present description.

FIG. 16 illustrates a partial cross-sectional view of another example of device 10 at a step in fabrication. In the present example, a layer of material 1026 or layer 1026 is provided overlying major surface 18 of region of semiconductor material 11. In accordance with the present description, conductive material 1026 is a combination of metal materials configured to provide a predetermined Schottky barrier height in a desired range. More particularly, the combination of metal components or materials is selected and processed to provide a predetermined Schottky barrier height within a range from about 0.45 eV to about 0.85 eV. Layer 1026 may also be referred to as conductive structure 1126.

More particularly, in some examples conductive material 1026 comprises a nickel-chrome alloy or an as-deposited layer 1026 comprising a combination of materials that include nickel and chrome. In some examples, layer 1026 comprises an as-deposited layer of nickel-chrome. In other examples, layer 1026 consists essentially of an as-deposited layer of nickel-chrome. In further examples, conductive material 1026 consists of an as-deposited layer of nickel-chrome. In some examples, conductive material 1026 is a nickel-chrome alloy material formed using sputtering techniques and a sputtering target with a selected nickel-chrome alloy composition. In one example, the sputter target can be a 40% nickel-60% chrome alloy composition. Other alloy compositions can be used as well.

In some examples, layer 1026 has an as-formed thickness in a range from about 400 Angstroms through about 1300 Angstroms. In other examples, layer 1026 has an as-formed thickness in a range from about 500 Angstroms through about 1100 Angstroms. In further examples, layer 1026 has an as-formed thickness in a range from about 600 Angstroms through about 1000 Angstroms.

In accordance with the present description, after layer 1026 is formed, layer 1026 is exposed to one or more elevated temperatures so that layer 1026 forms a silicide layer with region of semiconductor material 11. More particularly, layer 1026 preferably is exposed to one or more temperatures in a range of 400 degrees Celsius through about 550 degrees Celsius in the presence of presence of a gas that does not readily form reaction products with other materials, such as those used in device 10. By way of example, the annealing step is done in nitrogen. In some examples, layer 1026 preferably is exposed to one or more temperatures in a range of 400 degrees Celsius through about 500 degrees. In one example, a rapid thermal annealing process can be used with layer 1026 exposed to the predetermined temperature(s) between about 400 degrees Celsius and about 500 degrees Celsius for a time period of about 70 seconds to about 100 seconds. It was found through experimentation that temperatures in excess of about 550 to 600 degrees Celsius can result in stress at the upper corners 141 of the mesa regions 140 of device 10 adjacent to dielectric layers 222 of active trenches 23, which can result in diminished electrical performance.

After the anneal step is completed, the annealed material is exposed to a stripping or removal process to remove any unreacted material to form or provide Schottky contact regions 26 for device 10. In some examples, the annealed material is exposed to a wet chemical bath comprising sulfuric acid and hydrogen peroxide (SPM). In some examples, the wet chemical bath is heated to temperatures in excess of 100 degrees Celsius. In other examples, a wet chemical bath heated to a temperature of about 150 degrees Celsius is used to remove unreacted material to provide Schottky contact regions 26. In some examples, an etch or removal time of about 70 minutes through about 90 minutes is used with the thickness ranges for layer 1026 as described herein.

Figure 17:
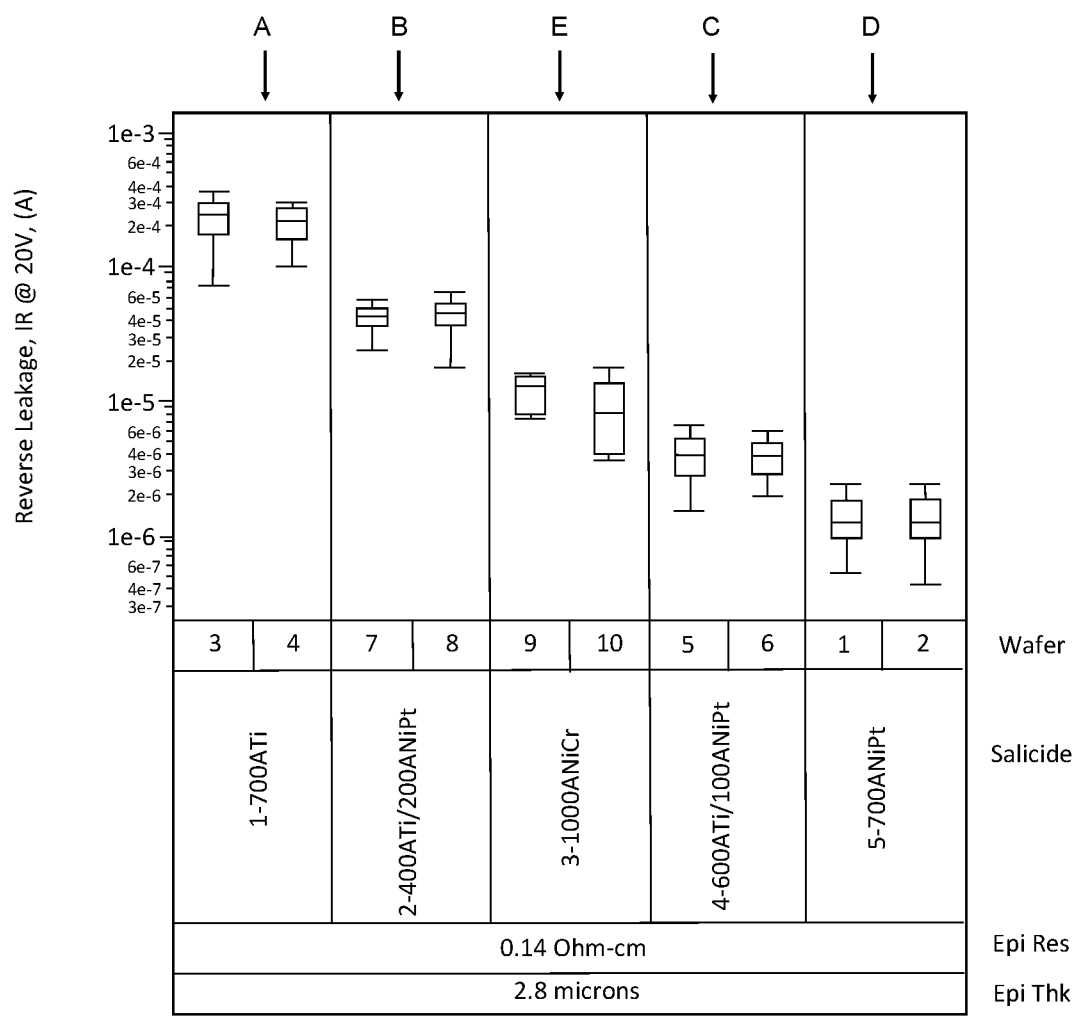
FIGS. 17 and 18 are charts illustrating comparative results of example semiconductor devices in accordance with the present description and prior semiconductor devices.
Figure 18:
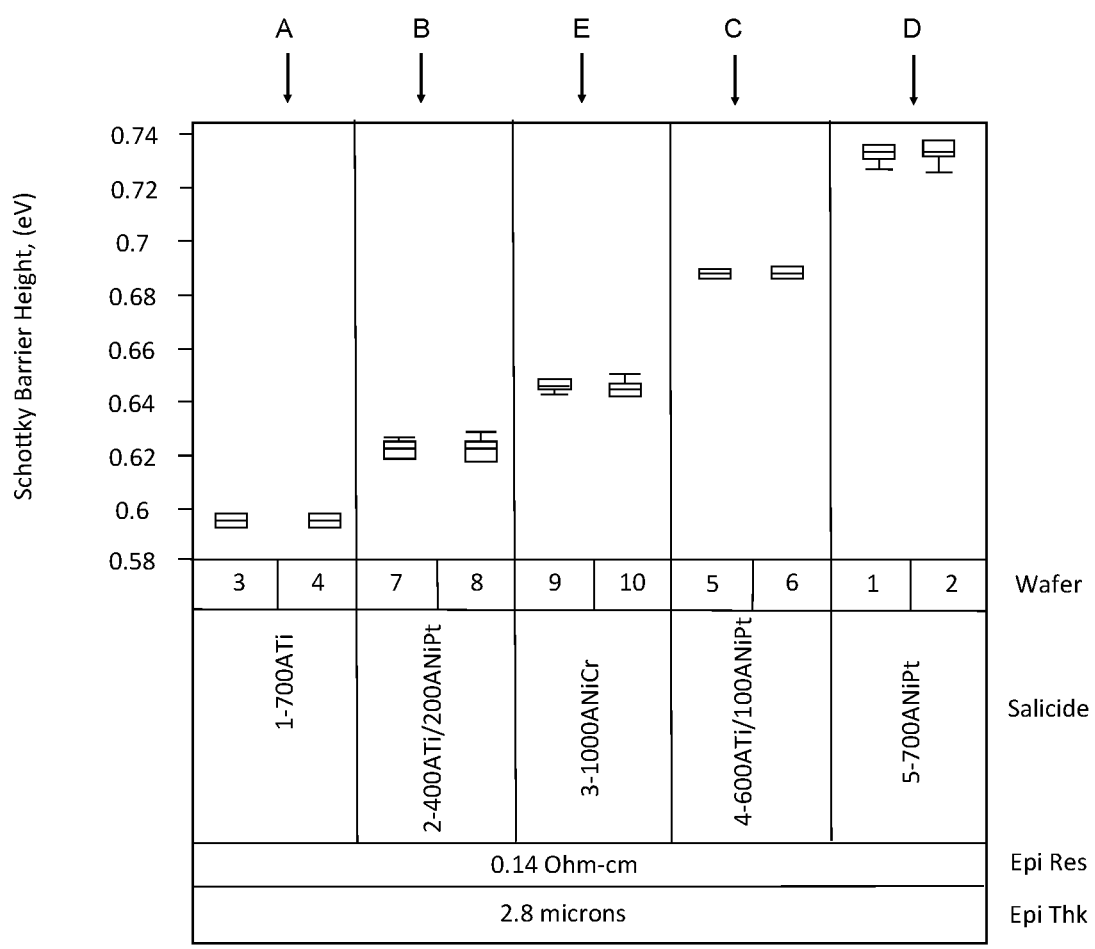

FIGS. 17 and 18 are box and whisker charts illustrating experimental results comparing three variations of device 10 in accordance with the present description. FIGS. 17 and 18 are similar to FIGS. 3 and 4 and only the differences will be described in herein. In particular, a column E is added to FIGS. 3 and 4 to provide FIGS. 17 and 18 respectively. Column E is data from two wafers of device 10 in accordance with the present description having a Schottky barrier structure 26 formed from a layer of nickel-chrome (for example, 40% nickel-60% chrome) having an as-formed thickness of about 1000 Angstroms. Columns A, B, C, and D are as described previously in conjunction with FIGS. 3 and 4.

As the data of FIGS. 17 and 18 illustrates, device 10 in accordance with the present description provides predetermined Schottky barrier heights within the range of 0.45 eV to 0.85 eV. In particular, the column E configuration of device 10 provides barrier heights from about 0.65 eV to about 0.68 eV with leakage current results that are within specification. In addition, the forward voltage at 70 mA is about 0.73 V for this configuration, which is within specification.

From all of the foregoing, one skilled in the art can determine that according to one example, a method of forming a semiconductor device, includes providing a region of semiconductor material comprising a first major surface and a second major surface opposite to the first major surface. The method includes providing a trench structure comprising a trench extending into the region of semiconductor material from the first major surface; and a conductive material disposed within the trench and separated from the region of semiconductor material by a dielectric region, wherein the dielectric region is disposed along opposing sidewall surfaces of the trench and disposed along a lower surface of the trench; and the dielectric region comprises a first uppermost surface. The method includes providing a Schottky contact region disposed adjacent to the first major surface and adjacent to the trench structure, wherein providing the Schottky contact region comprises forming a first layer of material disposed adjacent to the first major surface, the first layer of material consisting of titanium and having a first thickness; forming a second layer of material disposed adjacent to the first layer of material, the second layer of material consisting of nickel-platinum and having a second thickness; exposing the first layer of material and the second layer of material to a temperature in a range from about 650 degrees Celsius through about 700 degrees Celsius; and after the step of exposing, removing any unreacted portions of the first layer of material and the second layer of material.

In a further example, providing the trench structure can comprise providing the first uppermost surface of the dielectric region extending above an upper surface of the Schottky region in a cross-sectional view. In a still further example, providing the Schottky contact region comprises providing a first thickness to second thickness ratio greater than or equal to 1.33:1. In another example, providing the trench structure can comprise providing the first uppermost surface of the dielectric region extending above an upper surface of the Schottky region in a cross-sectional view. In a further example, providing the Schottky contact region comprises providing a first thickness to second thickness ratio of about 6:1. In a still further example, the method can further comprise forming a doped region in the region of semiconductor adjacent to the trench structure and adjacent to the Schottky contact region.

From all of the foregoing, one skilled in the art can determine that according to another example, a method of forming a semiconductor device can comprise providing a region of semiconductor material comprising a first major surface and a second major surface opposite to the first major surface. The method includes providing a trench structure comprising a trench extending into the region of semiconductor material from the first major surface; and a conductive material disposed within the trench and separated from the region of semiconductor material by a dielectric region. The method includes providing a Schottky contact region disposed adjacent to the first major surface and adjacent to the trench structure, wherein providing the Schottky contact region comprises forming a layer of material disposed adjacent to the first major surface, the layer of material comprising an as-formed layer of nickel-chrome and having a first thickness; exposing the layer of material to a temperature in a range from about 400 degrees Celsius through about 550 degrees Celsius; and after the step of exposing, removing any unreacted portions of the layer of material.

From all of the foregoing, one skilled the art can determine that according to a further example, a method of forming a semiconductor device, can comprise providing a region of semiconductor material comprising a first major surface and a second major surface opposite to the first major surface. The method includes providing a trench structure comprising a trench extending into the region of semiconductor material from the first major surface; and a conductive material disposed within the trench and separated from the region of semiconductor material by a dielectric region, wherein the dielectric region is disposed along opposing sidewall surfaces of the trench and disposed along a lower surface of the trench; and the dielectric region comprises a first uppermost surface. The method includes providing a Schottky contact region disposed adjacent to the first major surface and adjacent to the trench structure, wherein providing the Schottky contact region comprises forming a first layer of material disposed adjacent to the first major surface, the first layer of material consisting essentially of nickel-chrome and having a first thickness; exposing the first layer of material to a temperature in a range from about 400 degrees Celsius through about 550 degrees Celsius; and after the step of exposing, removing any unreacted portions of the first layer of material.

From all of the foregoing, one skilled in the art can determine that according to a still further example, a method of forming a semiconductor device can comprise providing a region of semiconductor material comprising a first major surface and a second major surface opposite to the first major surface. The method includes providing a trench structure comprising a trench extending into the region of semiconductor material from the first major surface; and a conductive material disposed within the trench and separated from the region of semiconductor material by a dielectric region, wherein: the dielectric region is disposed along opposing sidewall surfaces of the trench and disposed along a lower surface of the trench; and the dielectric region comprises a first uppermost surface. The method includes providing a Schottky contact region disposed adjacent to the first major surface and adjacent to the trench structure, wherein providing the Schottky contact region comprises forming a first layer of material disposed adjacent to the first major surface, the first layer of material consisting of an as-formed layer of nickel-chrome having a thickness; exposing the first layer of material to a temperature in a range from about 400 degrees Celsius through about 550 degrees Celsius; and after the step of exposing, removing any unreacted portions of the first layer of material.

In view of all of the above, it is evident that a novel structure and method of making the structure are disclosed. Included, among other features, is a Schottky contact region formed from a combination of conductive materials including titanium and nickel-platinum or a combination of conductive materials including a nickel-chrome alloy. In some examples, a layer of titanium if provided first following by a layer of nickel-platinum. In other examples, a layer of nickel-chrome is provided. The combination of conductive materials is then exposed to a predetermined elevated temperature to form a silicide region within the semiconductor device. The combination of materials provides Schottky barrier heights within a desired 0.45 eV to 0.85 eV range, provides a semiconductor device with improved power dissipation, and provides a semiconductor device with reduced stress-related defects, which, among other things, reduces leakage current. In addition, the combination of conductive layers reduces the amount of silicide migration in the area of the trench gate oxide, which further improves device performance. The structure and method can be implemented into existing process flows, which saves on manufacturing costs and cycle time.

While the subject matter of the invention is described with specific preferred embodiments and example embodiments, the foregoing drawings and descriptions thereof depict only typical examples of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed example. Thus, the hereinafter expressed claims are hereby expressly incorporated into this Detailed Description of the Drawings, with each claim standing on its own as a separate example of the invention. Furthermore, while some examples described herein include some but not other features included in other examples, combinations of features of different examples are meant to be within the scope of the invention and meant to form different examples as would be understood by those skilled in the art.

What is claimed is:

1. A method of forming a semiconductor device, comprising:
   providing a region of semiconductor material comprising a first major surface and a second major surface opposite to the first major surface;
   providing a trench structure comprising:
      a trench extending into the region of semiconductor material from the first major surface; and
      a conductive material disposed within the trench and separated from the region of semiconductor material by a dielectric region; and
   providing a Schottky contact region disposed adjacent to the first major surface and adjacent to the trench structure, wherein providing the Schottky contact region comprises:
      forming a first layer of material disposed adjacent to the first major surface, the first layer of material comprising titanium and having a first thickness;
      forming a second layer of material disposed adjacent to the first layer of material, the second layer of material comprising nickel-platinum and having a second thickness;
      exposing the first layer of material and the second layer of material to a temperature in a range from about 650 degrees Celsius through about 700 degrees Celsius; and
      after the step of exposing, removing any unreacted portions of the first layer of material and the second layer of material.

2. The method of claim 1, wherein:
   forming the first layer of material comprises forming the first layer of material consisting essentially of titanium.

3. The method of claim 1, wherein:
   forming the first layer of material comprises forming the first layer of material consisting of titanium.

4. The method of claim 1, wherein:
   forming the first layer of material comprises providing the first thickness in a range from about 300 Angstroms through about 800 Angstroms.

5. The method of claim 1, wherein:
   forming the second layer of material comprises forming the second layer of material consisting essentially of nickel-platinum.

6. The method of claim 1, wherein:
   forming the second layer of material comprises forming the second layer of material consisting of nickel-platinum.

7. The method of claim 1, wherein:
   forming the second layer of material comprises providing the second thickness in a range from about 100 Angstroms through about 350 Angstroms.

8. The method of claim 1, further comprising:
   forming a conductive layer overlying the Schottky contact region.

9. The method of claim 1, wherein:
   providing the trench structure comprises providing an active trench structure.

10. The method of claim 1, wherein:
    exposing the first layer of material and the second layer of material to the temperature comprises exposing for a time period of about 30 seconds to about 45 seconds.

11. The method of claim 1, wherein:
    providing the Schottky contact region comprises providing a first thickness to second thickness ratio greater than or equal to 2:1.

12. A method of forming a semiconductor device, comprising:

providing a region of semiconductor material comprising a first major surface and a second major surface opposite to the first major surface;
providing a trench structure comprising:
  a trench extending into the region of semiconductor material from the first major surface; and
  a conductive material disposed within the trench and separated from the region of semiconductor material by a dielectric region, wherein:
    the dielectric region is disposed along opposing sidewall surfaces of the trench and disposed along a lower surface of the trench; and
    the dielectric region comprises a first uppermost surface; and
providing a Schottky contact region disposed adjacent to the first major surface and adjacent to the trench structure, wherein providing the Schottky contact region comprises:
  forming a first layer of material disposed adjacent to the first major surface, the first layer of material consisting essentially of titanium and having a first thickness;
  forming a second layer of material disposed adjacent to the first layer of material, the second layer of material consisting essentially of nickel-platinum and having a second thickness;
  exposing the first layer of material and the second layer of material to a temperature in a range from about 650 degrees Celsius through about 700 degrees Celsius; and
  after the step of exposing, removing any unreacted portions of the first layer of material and the second layer of material.

13. The method of claim 12, wherein:
providing the Schottky contact region comprises providing a first thickness to second thickness ratio greater than or equal to 1.33:1.

14. The method of claim 12, wherein:
providing the Schottky contact region comprises providing a first thickness to second thickness ratio of about 6:1.

15. The method of claim 12, wherein:
providing the trench structure comprises providing the first uppermost surface of the dielectric region extending above an upper surface of the Schottky region in a cross-sectional view.

16. The method of claim 12, further comprising:
forming a conductive layer overlying the Schottky contact region, wherein:
providing the trench structure comprises providing an active trench structure; and
exposing the first layer of material and the second layer of material to the temperature comprises exposing for a time period of about 30 seconds to about 45 seconds in nitrogen.

17. The method of claim 12, wherein:
providing the region of semiconductor material comprises:
  providing a semiconductor substrate; and
  providing a semiconductor layer overlying the substrate;
the semiconductor layer includes the first major surface; and
the semiconductor layer comprises a non-uniform dopant profile over its thickness.

18. A method of forming a semiconductor device, comprising:
providing a region of semiconductor material comprising a first major surface and a second major surface opposite to the first major surface;
providing a trench structure comprising:
  a trench extending into the region of semiconductor material from the first major surface; and
  a conductive material disposed within the trench and separated from the region of semiconductor material by a dielectric region, wherein:
    the dielectric region is disposed along opposing sidewall surfaces of the trench and disposed along a lower surface of the trench; and
    the dielectric region comprises a first uppermost surface; and
providing a Schottky contact region disposed adjacent to the first major surface and adjacent to the trench structure, wherein providing the Schottky contact region comprises:
  forming a conductive structure comprising:
    a first layer of material consisting essentially of titanium disposed adjacent to the first major surface and a second layer of material disposed adjacent to the first layer of material and consisting essentially of nickel-platinum;
  exposing the conductive structure to an elevated temperature to form a silicide structure;
  after the step of exposing, removing any unreacted portions of the conductive structure,
  and wherein:
    forming the conductive structure comprises:
      forming the first layer of material consisting essentially of titanium having a first thickness;
      forming the second layer of material consisting essentially of nickel-platinum having a second thickness; and
      providing a first thickness to second thickness ratio greater than or equal to 1.33:1; and
    exposing comprises exposing the first layer of material and the second layer of material to a temperature in a range from about 650 degrees Celsius through about 700 degrees Celsius.

* * * * *